(12) United States Patent
Tsuyutani et al.

(10) Patent No.: US 11,393,761 B2
(45) Date of Patent: Jul. 19, 2022

(54) CIRCUIT BOARD AND ITS MANUFACTURING METHOD

(71) Applicant: TDK CORPORATION, Tokyo (JP)

(72) Inventors: Kazutoshi Tsuyutani, Tokyo (JP); Yoshihiro Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/724,232

(22) Filed: Dec. 21, 2019

(65) Prior Publication Data

US 2020/0203278 A1 Jun. 25, 2020

(30) Foreign Application Priority Data

Dec. 25, 2018 (JP) .............................. JP2018-241119
Oct. 17, 2019 (JP) .............................. JP2019-190512

(51) Int. Cl.
*H01L 23/538* (2006.01)
*H01L 21/48* (2006.01)

(52) U.S. Cl.
CPC ........ *H01L 23/5383* (2013.01); *H01L 21/486* (2013.01); *H01L 21/4857* (2013.01); *H01L 23/5384* (2013.01); *H01L 23/5389* (2013.01)

(58) Field of Classification Search
CPC ............. H01L 23/5383; H01L 23/5389; H01L 21/486; H01L 21/4857; H01L 23/5384
See application file for complete search history.

(56) References Cited

U.S. PATENT DOCUMENTS

| 2015/0137238 A1* | 5/2015 | Tsunemi | ................. H01L 24/11 257/347 |
| 2017/0069532 A1* | 3/2017 | Lee | ......................... H01L 24/20 |

FOREIGN PATENT DOCUMENTS

JP 2013229548 A 11/2013

* cited by examiner

*Primary Examiner* — Selim U Ahmed
*Assistant Examiner* — Evan G Clinton
(74) *Attorney, Agent, or Firm* — Young Law Firm, P.C.

(57) ABSTRACT

Disclosed herein is a circuit board that includes first and second conductor layers, an insulating layer positioned between the first and second conductor layers, and a via conductor formed inside a via penetrating the insulating layer and connecting the first and second conductor layers. The via has a shape in which a diameter thereof is reduced in a depth direction. The via has a first section positioned on the first conductor layer side and a second section positioned on the second conductor layer side. A reduction in the diameter per unit depth in the first section is greater than that in the second section.

12 Claims, 21 Drawing Sheets

CIRCUIT BOARD AND ITS MANUFACTURING METHOD

BACKGROUND OF THE INVENTION

Field of the Invention

The present invention relates to a circuit board and its manufacturing method and, more particularly, to a circuit board having a multilayer wiring structure and its manufacturing method.

Description of Related Art

As a circuit board having a multilayer wiring structure, there is known one described in JP 2013-229548 A. The circuit board described in JP 2013-229548 A has a semiconductor IC embedded therein, and a via conductor connecting conductor layers thereabove and therebelow is provided at a position not overlapping the semiconductor IC in a plan view.

However, in the circuit board described in JP 2013-229548 A, the angle of the inner wall of a via in which the via conductor is embedded is nearly vertical, so that the film thickness of the conductor layer may be reduced at the edge of the via or disconnection may occur there. To solve such a problem, the tapered angle of the inner wall of the via may be increased; however, in this case, the occupied area of the via increases, thus disadvantageously preventing high density mounting.

SUMMARY

It is therefore an object of the present invention to provide a circuit board having high connection reliability of the via conductor while achieving high density mounting.

A circuit board according to one aspect of the present invention includes: first and second conductor layers; an insulating layer positioned between the first and second conductor layers; and a via conductor formed inside a via penetrating the insulating layer and connecting the first and second conductor layers. The via has a shape in which the diameter thereof is reduced in the depth direction. The via has a first section positioned on the first conductor layer side and a second section positioned on the second conductor layer side. A reduction in the diameter per unit depth in the first section is greater than that in the second section.

According to the one aspect of the present invention, the angle of the edge of the via positioned at the end portion of the first section is alleviated, making it possible to increase connection reliability of the via conductor.

In the present invention, the first section may have a shape in which a reduction in the diameter per unit depth in the first section may become greater as the position in the depth direction becomes deeper. With this configuration, the volume of the via can be increased.

The circuit board according to the present invention may further include a semiconductor IC embedded in the insulating layer. The thickness of the semiconductor IC may be less than the depth dimension of the second section, and the depth position thereof may be within the second section. With the above configuration, the semiconductor IC can be brought closer to the via, allowing achievement of high density mounting.

A circuit board according to another aspect of the present invention is a circuit board having an electronic component embedded therein and includes: an insulating layer that covers a terminal electrode of the electronic component; a conductor layer that covers the electronic component through the insulating layer; and a via conductor formed inside a via penetrating the insulating layer and connecting the terminal electrode and the conductor layer. The via has a shape in which the diameter thereof is reduced in the depth direction. The via has a first section positioned on the conductor layer side and a second section positioned on the terminal electrode side. A reduction in the diameter per unit depth in the first section is larger than that in the second section.

According to the another aspect of the present invention as well, the angle of the edge of the via positioned at the end portion of the first section is alleviated, making it possible to increase connection reliability of the via conductor.

A circuit board manufacturing method according to the present invention includes the steps of: preparing a structure including first and second conductor layers and an insulating layer positioned between the first and second conductor layers and forming an opening exposing a part of the insulating layer by patterning the first conductor layer; forming a via penetrating the insulating layer by applying laser processing to the center of the opening; enlarging, after application of the laser processing, the diameter of the upper portion of the via by performing blasting with the first conductor layer as a mask; and forming a via conductor inside the via to connect the first and second conductor layers.

According to the present invention, two-stage processing including the laser processing and blasting is performed, so that the first and second sections of the via can be made to differ in shape from each other. Thus, the angle of the edge of the via positioned at the end portion of the first section is alleviated, making it possible to increase connection reliability of the via conductor.

As described above, according to the present invention, there can be provided a circuit board having high connection reliability of the via conductor while achieving high density mounting and its manufacturing method.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
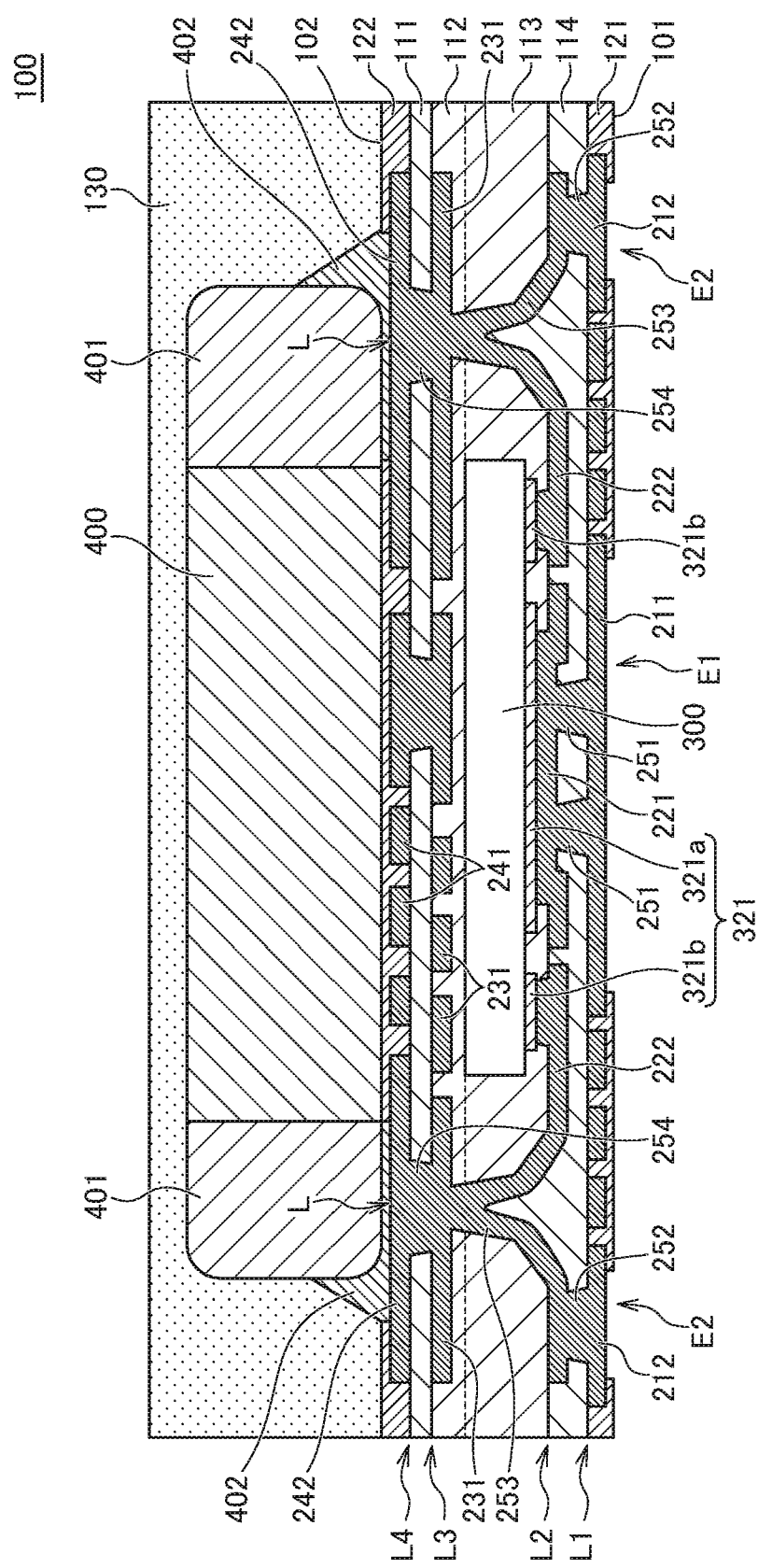
FIG. 1 is a schematic cross-sectional view for explaining the structure of a semiconductor IC-embedded substrate according to a first embodiment of the present invention.

FIG. 1 is a schematic cross-sectional view for explaining the structure of a semiconductor IC-embedded substrate 100 according to the first embodiment of the present invention.

As illustrated in FIG. 1, the semiconductor IC-embedded substrate 100 according to the present embodiment includes four insulating layers 111 to 114 and conductor layers L1 to L4 positioned on the surfaces of the respective insulating layers 111 to 114. Although not particularly limited, the insulating layer 111 positioned in the uppermost layer and the insulating layer 114 positioned in the lowermost layer may each be a core layer obtained by impregnating a core material such as glass fiber with a resin material such as epoxy. On the other hand, the insulating layers 112 and 113 may each be made of a resin material not including a core material such as glass cloth. Particularly, the thermal expansion coefficient of the insulating layers 111 and 114 is preferably smaller than that of the insulating layers 112 and 113.

The insulating layer 114 positioned in the lowermost layer and the conductor layer L1 formed on the surface of the insulating layer 114 may be partially covered by a solder resist 121. Similarly, the insulating layer 111 positioned in the uppermost layer and the conductor layer L4 formed on the surface of the insulating layer 111 may be partially covered by a solder resist 122. Although not particularly limited, the solder resist 121 constitutes a lower surface 101 of the semiconductor IC-embedded substrate 100, and the solder resist 122 constitutes an upper surface 102 of the semiconductor IC-embedded substrate 100. In the present embodiment, an electronic component 400 may be mounted on the upper surface 102 of the semiconductor IC-embedded substrate 100. The electronic component 400 may be a passive component such as a capacitor or an inductor. The electronic component 400 is sealed with a mold resin 130 covering the upper surface 102 of the semiconductor IC-embedded substrate 100. Only one electronic component 400 is mounted in the example of FIG. 1, but in practice, more electronic components 400 may be mounted.

As illustrated in FIG. 1, the semiconductor IC-embedded substrate 100 according to the present embodiment has a semiconductor IC 300 embedded in the insulating layer 113. The semiconductor IC 300 is embedded such that the main surface thereof having a pad electrode thereon faces the lower surface 101 side, and the back surface thereof faces the upper surface 102 side. Although details will be described later, a rewiring layer 321 connected to the pad electrode is provided on the main surface of the semiconductor IC 300. The rewiring layer 321 includes rewiring patterns 321a and 321b. Although only one semiconductor IC 300 is provided in the example of FIG. 1, two or more semiconductor ICs 300 may be provided.

The conductor layer L1 includes wiring patterns 211 and 212. A part of the wiring pattern 211 that is not covered with the solder resist 121 and a part of the wiring pattern 212 that is not covered with the solder resist 121 constitute external terminals E1 and E2, respectively, of the semiconductor IC-embedded substrate 100. The external terminal E1 is used as a terminal for applying a power supply potential (typically, a ground potential) to the semiconductor IC 300. The external terminal E2 is provided in plural numbers in the semiconductor IC-embedded substrate 100 and used as a signal terminal, a power supply terminal or a dummy terminal.

The conductor layer L2 includes wiring patterns 221 and 222. The wiring pattern 221 is connected to the wiring pattern 211 of the conductor layer L1 through a plurality of via conductors 251 penetrating the insulating layer 114. Only two via conductors 251 are provided in the example of FIG. 1, but in practice, more via conductors 251 may be provided. As illustrated in FIG. 1, the wiring pattern 221 contacts the rewiring pattern 321a of the semiconductor IC 300 over a large area. The wiring pattern 222 is connected to the rewiring pattern 321b of the semiconductor IC 300 and to the wiring pattern 212 of the conductor layer L1 through a via conductor 252 penetrating the insulating layer 114.

The conductor layer L3 includes a wiring pattern 231. A part of the wiring pattern 231 is connected to the wiring pattern 222 of the conductor layer L2 through a plurality of via conductors 253 penetrating the insulating layers 112 and 113. The via conductors 253 are disposed at a location not overlapping the semiconductor IC 300 in a plan view.

The conductor layer L4 includes wiring patterns 241 and 242. A part of the wiring pattern 242 is connected to the wiring pattern 231 of the conductor layer L3 through a plurality of via conductors 254 penetrating the insulating layer 111. Further, a part of the wiring pattern 242 that is not covered with the solder resist 122 constitutes a land pattern L. The land pattern L is connected to a terminal electrode 401 of the electronic component 400 through a solder 402.

Figure 2:
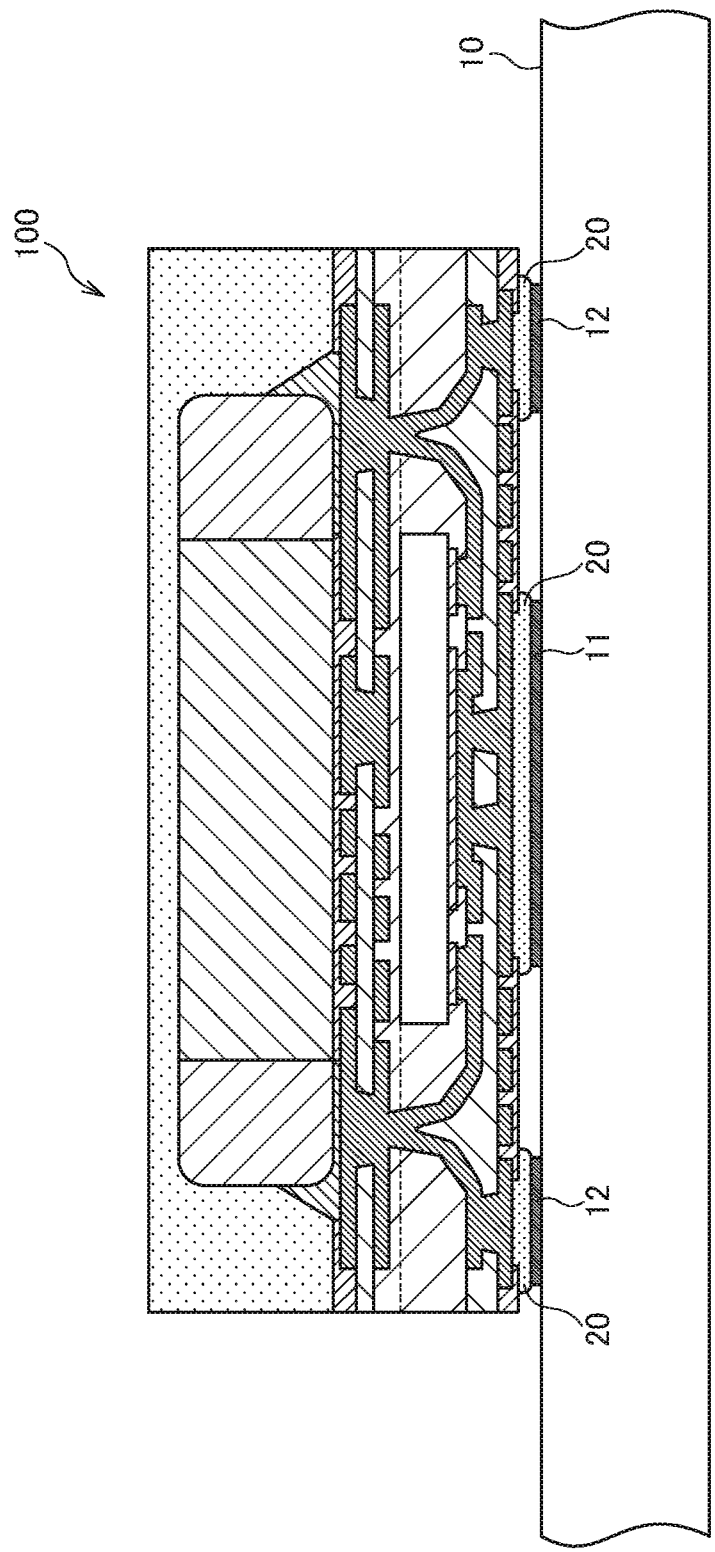
FIG. 2 is a schematic cross-sectional view illustrating a state where the semiconductor IC-embedded substrate shown in FIG. 1 is mounted on a mother board.

FIG. 2 is a schematic cross-sectional view illustrating a state where the semiconductor IC-embedded substrate 100 according to the present embodiment is mounted on a mother board 10. As illustrated in FIG. 2, the semiconductor IC-embedded substrate 100 is mounted such that the lower surface 101 thereof faces the mother board 10, and land patterns 11 and 12 provided on the mother board 10 and the external terminals E1 and E2 of the semiconductor IC-embedded substrate 100 are connected respectively to each other through a solder 20.

Figure 3:
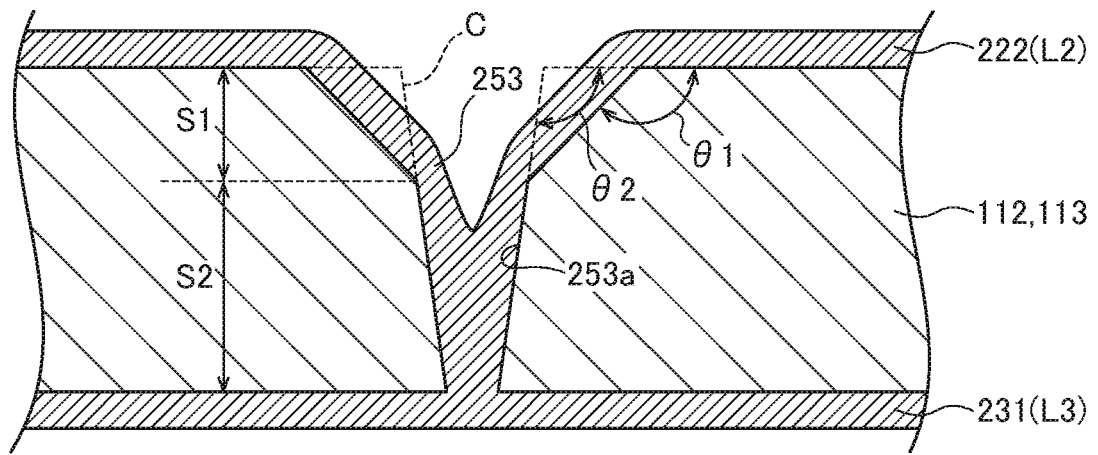
FIG. 3 is a schematic cross-sectional view for explaining a shape of the via.
Figure 4:
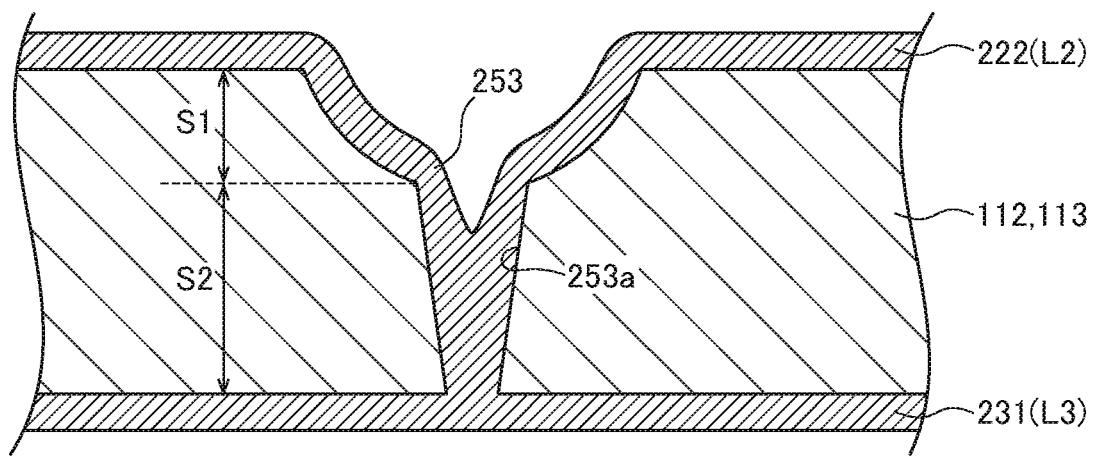
FIG. 4 is a schematic cross-sectional view for explaining a shape of the via according to a modification.
Figure 5:
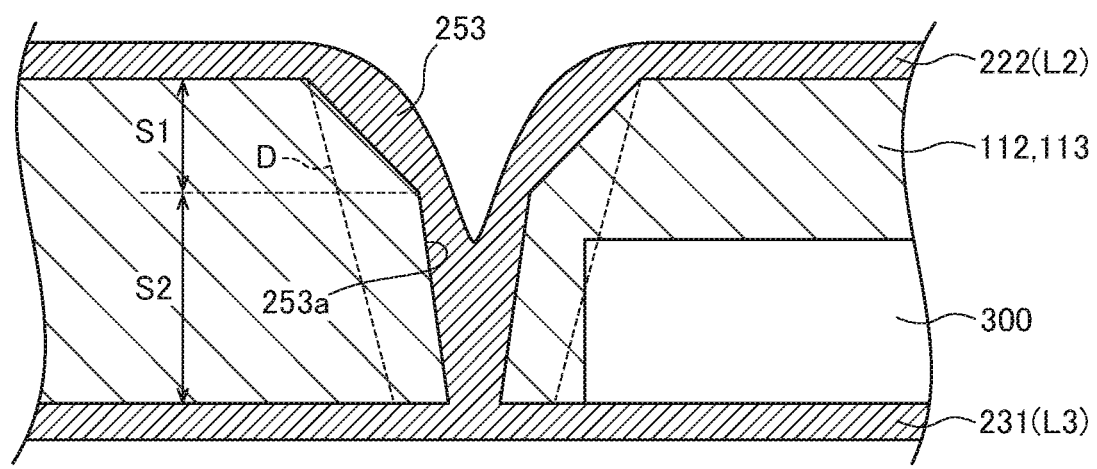
FIG. 5 is a schematic cross-sectional view for explaining a positional relationship between the via and the semiconductor IC.

FIGS. 3 to 5 are detailed cross-sectional views of the via connecting the conductor layers L2 and L3. A via 253a in which the via conductor 253 is embedded may be configured such that the diameter thereof is reduced in the depth direction and that the shape thereof in a section S1 positioned on the conductor layer L2 side and the shape in a section S2 positioned on the conductor layer L3 side differ from each other. In the example illustrated in FIG. 3, the inner wall of the via 253a is nearly vertical, having a steeper angle in the section S2 than in the section S1. In other words, a reduction in the diameter per unit depth in the section S1 is larger than that in the section S2. By forming the via 253a into such a shape, an angle θ1 between the inner wall in the section S1 and the surface of the insulating layer 113 becomes large, so that the coverage of the conductor layer L2 at the edge of the via 253a is enhanced, with the result that connection reliability of the via conductor 253 can be increased.

On the other hand, as denoted by dashed line C, when the entire via 253a has the same shape as the section S2, an angle θ2 at the edge of the via 253a becomes small, so that, at this portion, the film thickness of the conductor layer L2 may be reduced or disconnection may occur. Such a problem can be solved by forming the via 253a into the above-described shape. The shape illustrated in FIG. 3 is obtained by forming the via 253a from the conductor layer L2 side and, thus, when the via 253a is formed from the conductor layer L3 side, the vertical position of the first and second sections S1 and S2 is reversed from that illustrated in FIG. 3.

The shape of the section S1 may be curved as illustrated in FIG. 4. That is, a reduction in the diameter per unit depth in the section S1 may be increased as the position in the depth direction is reduced. Thus, the volume of each via 253a can be increased.

Further, when the via 253a is formed into the shape illustrated in FIG. 3 or FIG. 4, the distance between the semiconductor IC 300 and the via 253a can be reduced, as illustrated in FIG. 5. This allows a reduction in the planar size of the semiconductor IC-embedded substrate 100. That is, as denoted by dotted line D, when the inner wall of the via 253a is made linear with the diameter thereof at the upper end fixed, the semiconductor IC 300 cannot be disposed at the position illustrated in FIG. 5 but needs to be disposed in a position further away from the via 253a. On the other hand, when the via 253a is formed into the shape illustrated in FIG. 3 or FIG. 4, the semiconductor IC 300 can be brought closer to the via 253a. To achieve such an effect, the thickness of the semiconductor IC 300 may be reduced to less than the depth of the section S2, and the depth position of the semiconductor IC 300 may be set within the section S2.

The following describes a manufacturing method for the semiconductor IC-embedded substrate 100 according to the present embodiment.

FIGS. 6 to 17 are process views for explaining the manufacturing method for the semiconductor IC-embedded substrate 100 according to the present embodiment.

Figure 6:
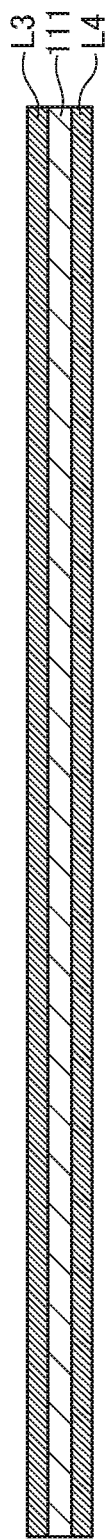
FIGS. 6 to 17 are process views for explaining the manufacturing method for the semiconductor IC-embedded substrate shown in FIG. 1.

As illustrated in FIG. 6, a base material (a work board) formed by attaching the conductor layers L3 and L4 made of a Cu foil to both surfaces of the insulating layer 111 including a core material such as glass fiber, i.e., a double-sided CCL (Copper Clad Laminate) is prepared. In order to ensure appropriate rigidity for easy handling, the thickness of the core material included in the insulating layer 111 is preferably equal to or more than 40 µm. The material of the conductor layers L3 and L4 is not particularly limited, and examples include metal conductive materials such as Au, Ag, Ni, Pd, Sn, Cr, Al, W, Fe, Ti and SUS in addition to the above-mentioned Cu and, among them, Cu is preferable in terms of conductivity and cost. The same applies to the conductor layers L1 and L2 to be described later.

The resin material forming the insulating layer 111 is not particularly limited as long as it can be formed into a sheet shape or a film shape, and examples include: a single element selected from the group consisting of vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+activated ester curing resin, polyphenylene ether resin (polyphenylene oxide resin), curable polyolefin resin, benzo cyclobutene resin, polyimide resin, aromatic polyester resin, aromatic liquid crystal polyester resin, polyphenylene sulfide resin, polyether imide resin, polyacrylate resin, polyetheretherketone resin, fluororesin, epoxy resin, phenolic resin, and benzoxazine resin in addition to glass epoxy; a material obtained by adding, to one of the above-listed resins, silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like; and a material obtained by adding, to one of the above-listed resins, metal oxide powder containing at least one metal selected from the group consisting of magnesium, silicon, titanium, zinc, calcium, strontium, zirconium, tin, neodymium, samarium, aluminum, bismuth, lead, lanthanum, lithium and tantalum, and these examples may be selectively used as appropriate from the viewpoints of electrical characteristics, mechanical characteristics, water absorption properties, reflow durability, etc. Further, examples of the core material included in the insulating layer 111 include a material blended with, e.g., resin fiber such as glass fiber or aramid fiber. The same is true on the other insulating layers 112 to 114 described later.

Figure 7:
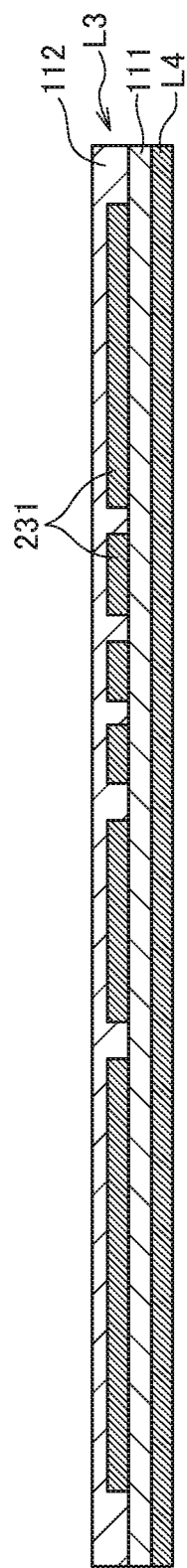

Then, as illustrated in FIG. 7, a known method such as photolithography is used to pattern the conductor layer L3 to form the wiring pattern 231. Further, for example, an uncured (B stage) resin sheet is laminated on the surface of the insulating layer 111 by vacuum pressure bonding or the like so as to embed therein the wiring pattern 231 to thereby form the insulating layer 112.

Figure 8:
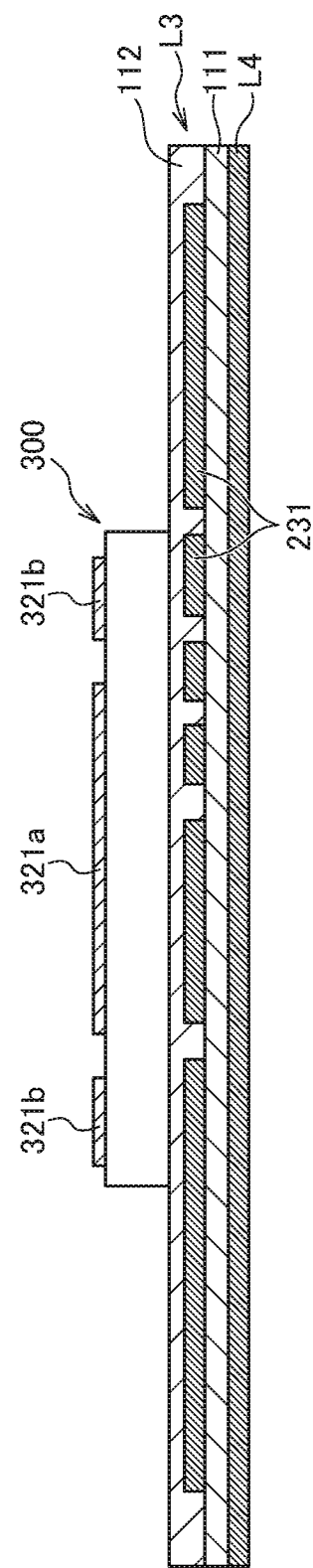

Then, as illustrated in FIG. 8, the semiconductor IC 300 is placed on the insulating layer 112. The semiconductor IC 300 is face-up mounted such that the main surface thereof on which the rewiring patterns 321a and 321b are exposed face upward. As describe above, the semiconductor IC 300 may be made thinner. Specifically, the thickness of the semiconductor IC 300 is, e.g., equal to or less than 200 µm, preferably, about 50 µm to about 100 µm. In terms of cost, it is preferable to simultaneously apply machining to many semiconductor ICs 300 in a wafer state and, in this case, the back surface is first ground, and then the wafer is diced to obtain individual semiconductor ICs 300. Alternatively, when the wafer is diced into individual semiconductor ICs 300 or half-cut before thinning by means of polishing, the back surface can be polished while the main surface of the semiconductor IC 300 is covered with a thermosetting resin. Thus, there are various possible processing orders among insulating film grinding, electronic component back surface grinding and dicing. Further, the back surface of the semiconductor IC 300 can be roughened by etching, plasma processing, laser processing, blasting, polishing with a grinder, buffing, chemical treatment or the like. With these methods, it is possible to not only achieve thinning of the semiconductor IC 300, but also to enhance adhesion to the insulating layer 112.

Figure 9:
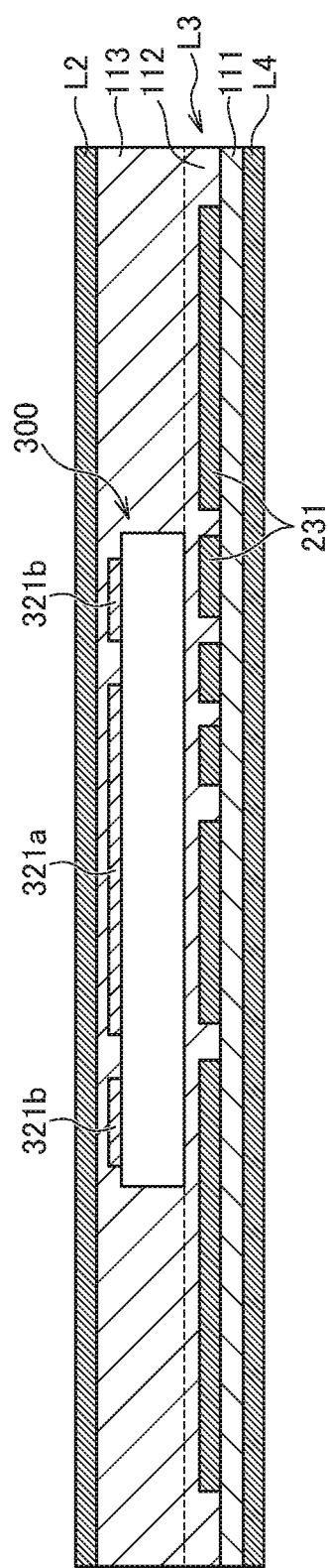

Then, as illustrated in FIG. 9, the insulating layer 113 and the conductor layer L2 are formed so as to cover the semiconductor IC 300. Preferably, the insulating layer 113 is formed as follows: after application of an uncured or semi-cured thermosetting resin, the resin (when it is an uncured resin) is semi-cured by heating, and then the semi-cured resin and the conductor layer L2 are pressed together by a pressing means to obtain a cured insulating layer 113. The insulating layer 113 is preferably a resin sheet not containing fiber that prevents the embedding of the semiconductor IC 300. This enhances adhesion among the insulating layer 113, conductor layer L2, insulating layer 112 and semiconductor IC 300.

Figure 10:
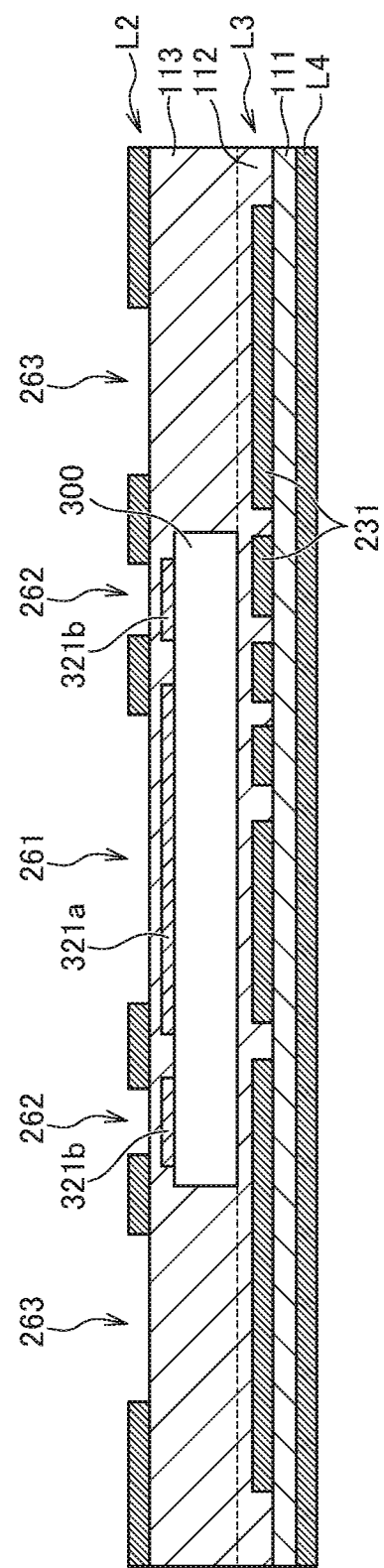

Then, as illustrated in FIG. 10, a part of the conductor layer L2 is etched away using a known method such as photolithography to form openings 261 to 263 exposing the insulating layer 113. The opening 261 is formed at a location overlapping the rewiring pattern 321a, the opening 262 is formed at a location overlapping the rewiring pattern 321b, and the opening 263 is formed at a location not overlapping the semiconductor IC 300 but overlapping the wiring pattern 231 of the conductor layer L3. The diameter of the opening 261 is smaller than the planar size of the rewiring pattern 321a, whereby the entire opening 261 overlaps the rewiring pattern 321a in a plan view. Similarly, the diameter of the opening 262 is smaller than the planar size of the rewiring pattern 321b, whereby the entire opening 262 overlaps the rewiring pattern 321b in a plan view.

Figure 11:
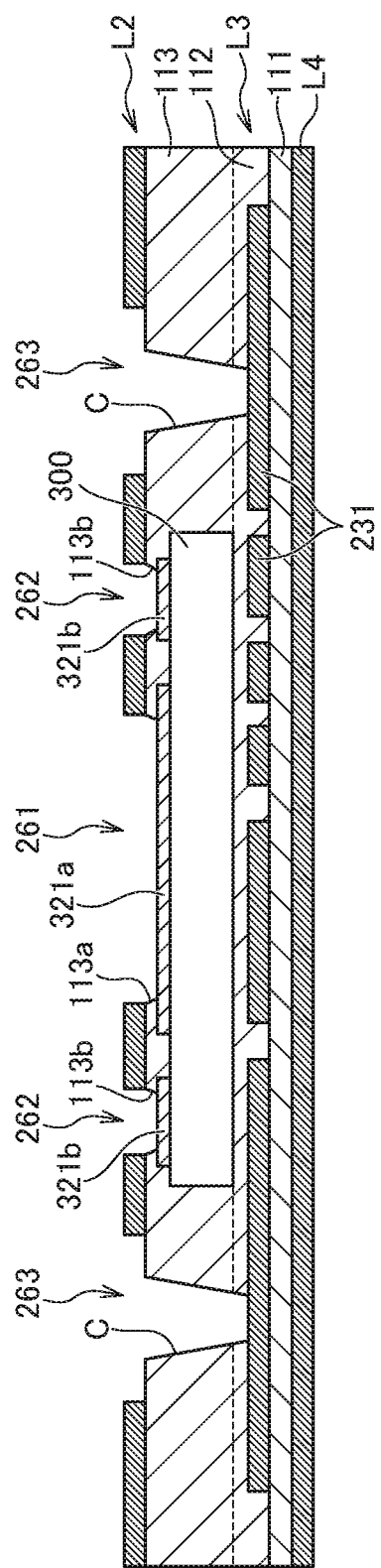

Then, as illustrated in FIG. 11, laser processing is applied to the center of the opening 263 to form a via C in the insulating layers 112 and 113. The via C is formed corresponding to dashed line C in FIG. 3. That is, the entire via C has the same shape as the section S2. The laser light is not irradiated on the entire opening 263, but only on the center thereof so as to leave a ring-shaped unprocessed region. In addition, laser processing is applied to the openings 261 and 262 to form openings 113a and 113b in the insulating layer 113. The rewiring patterns 321a and 321b are exposed from the openings 113a and 113b, respectively.

Figure 12:
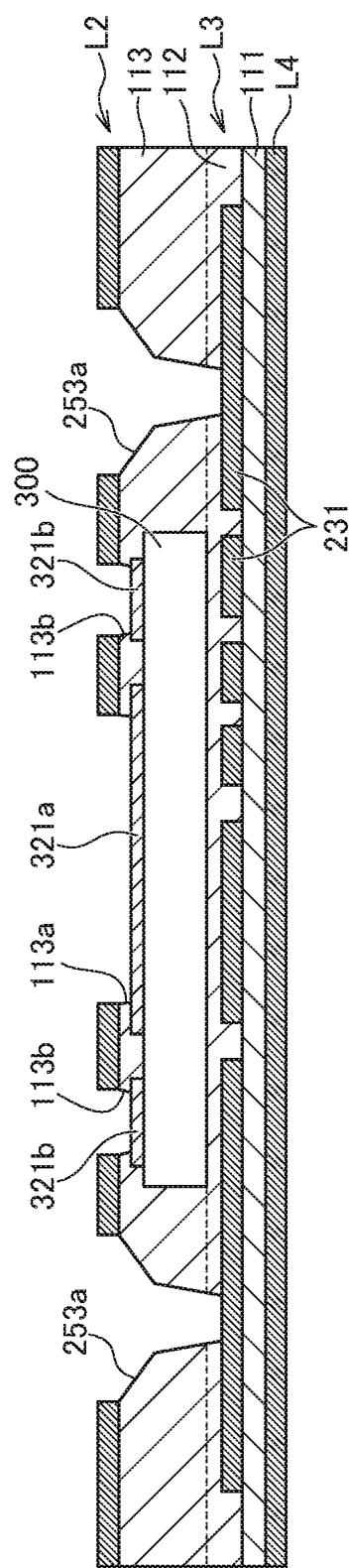

Then, as illustrated in FIG. 12, blasting is applied with the conductor layer L2 as a mask to remove the insulating layer 113 at a portion where it is not covered with the conductor layer L2. As a result, at a location corresponding to the opening 263 of the conductor layer L2, the diameter of the upper portion of the via C is increased by the blasting, whereby the via 253a having the sections S1 and S2 illustrated in FIG. 3 is formed. Thus, the via 253a is subjected to laser processing and then to blasting to have a shape having the sections S1 and S2 illustrated in FIG. 3. Therefore, the shape of the section S1 is mainly attributable to the blasting, and the shape of the section S2 is mainly attributable to the laser processing.

Figure 13:
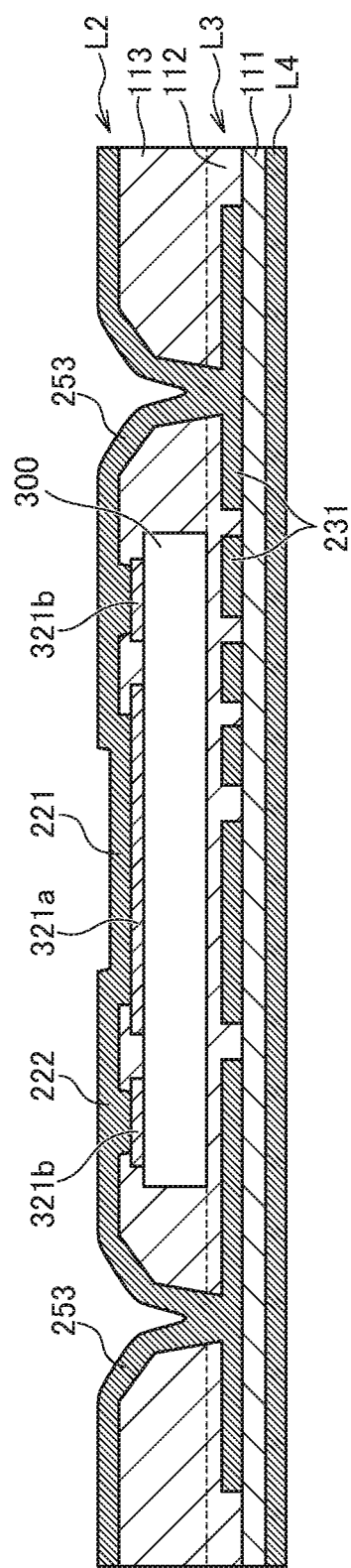

Then, as illustrated in FIG. 13, electroless plating and electrolytic plating are applied to form the via conductor 253 and to form the wiring patterns 221 and 222 contacting the rewiring patterns 321a and 321b, respectively.

Figure 14:
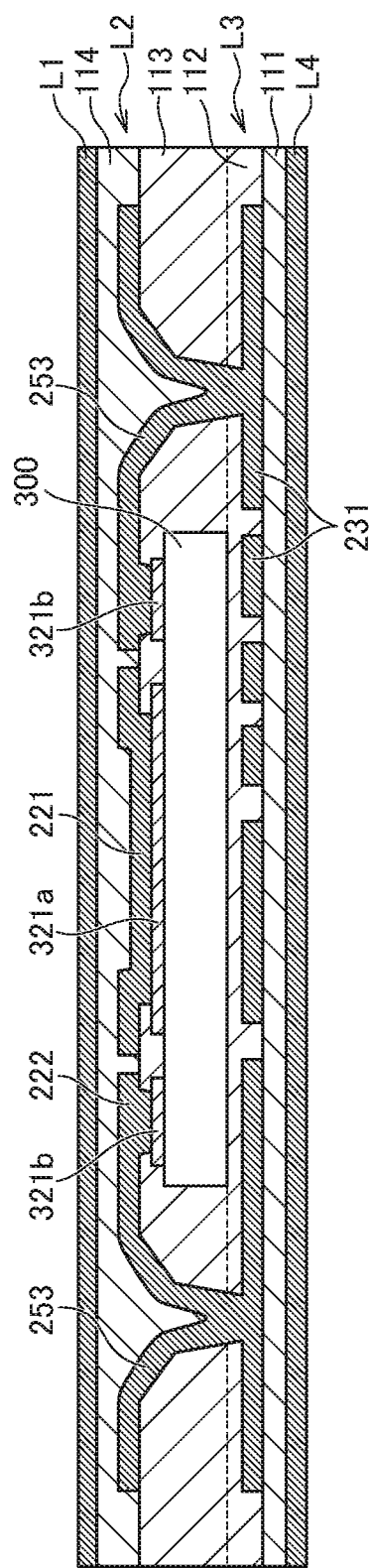

Then, as illustrated in FIG. 14, the wiring patterns 221 and 222 are patterned by a known method to separate them from each other. Thereafter, a sheet having the insulating layer 114 and the conductor layer L1 laminated thereon is hot-pressed under vacuum so as to embed therein the conductor layer L2. The material and thickness of the insulating layer 114 may be the same as those of the insulating layer 111.

Figure 15:
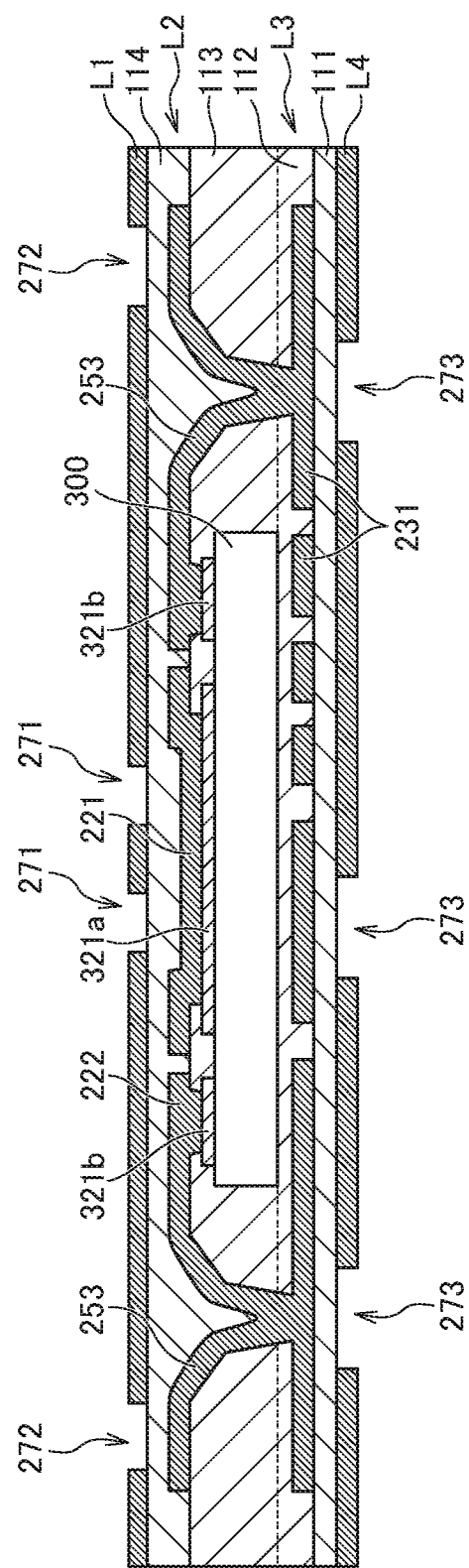

Then, as illustrated in FIG. 15, a part of the conductor layer L1 and a part of the conductor layer L4 are etched away using a known method such as photolithography to form openings 271 and 272 exposing the insulating layer 114 and an opening 273 exposing the insulating layer 111. The opening 271 is formed in a plural number at a location overlapping the wiring pattern 221, the opening 272 is formed at a location overlapping the wiring pattern 222, and the opening 273 is formed at a location overlapping the wiring pattern 231. The wiring pattern 221 is provided at a location overlapping the semiconductor IC 300, so that the opening 271 is also formed at a location overlapping the semiconductor IC 300. Although the opening 272 is formed at a location not overlapping the semiconductor IC 300 in the example of FIG. 15, some openings 272 may be formed at locations overlapping the semiconductor IC 300.

Figure 16:
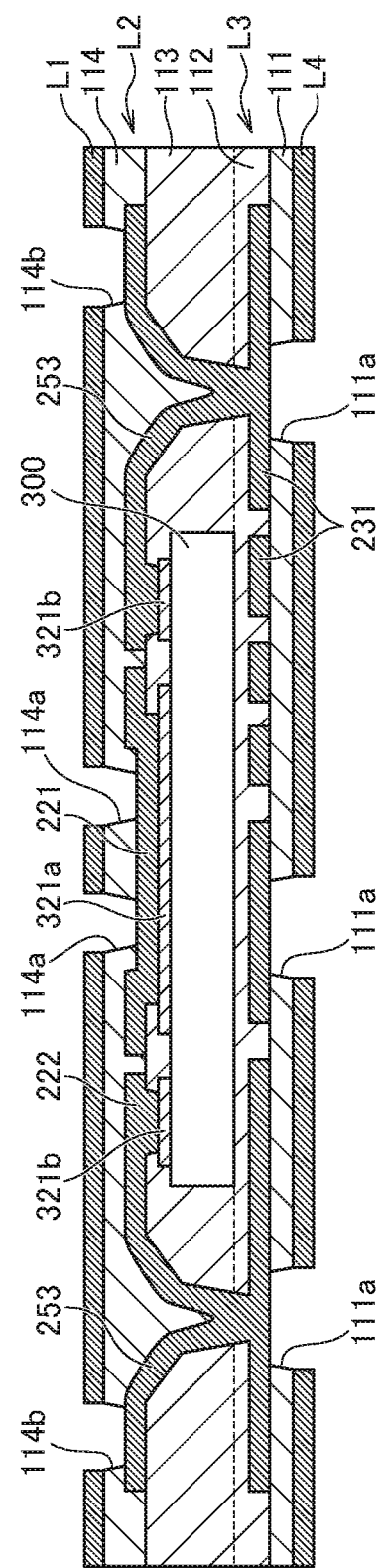

Then, as illustrated in FIG. 16, known blasting or laser processing is applied to the openings 271 to 273 to remove a part of the insulating layer 114 that is not covered with the conductor layer L1 and a part of the insulating layer 111 that is not covered with the conductor layer L4. As a result, the opening 114a is formed in the insulating layer 114 at a location corresponding to the opening 271 of the conductor layer L1 to expose the wiring pattern 221. Similarly, the opening 114b is formed in the insulating layer 114 at a location corresponding to the opening 272 of the conductor layer L1 to expose the wiring pattern 222. Further, the wiring pattern 231 is exposed at a location corresponding to the opening 111a of the conductor layer L4.

Figure 17:
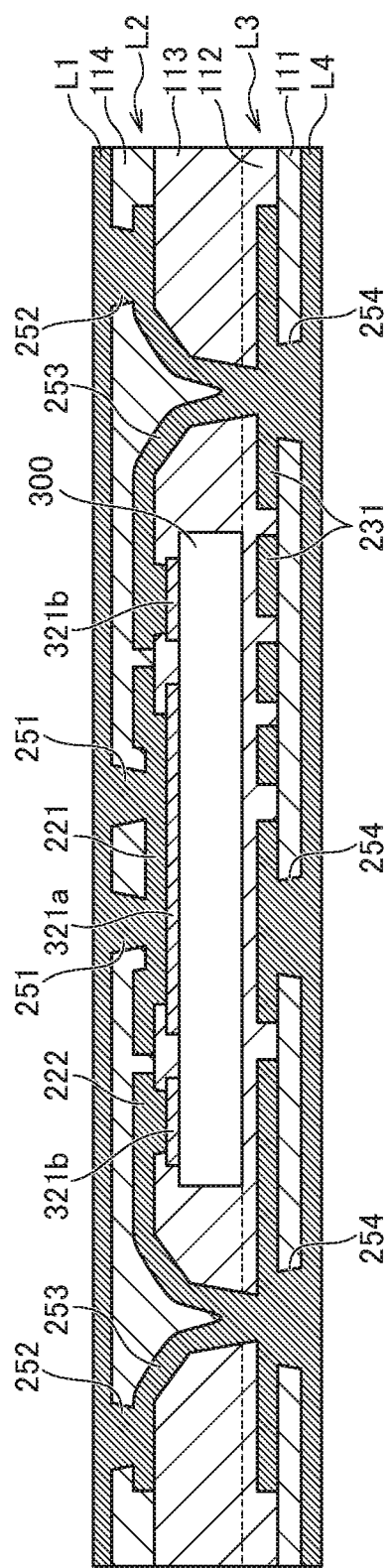

Then, as illustrated in FIG. 17, electroless plating and electrolytic plating are applied to form the via conductors 254, 251 and 252 inside the openings 111a, 114a and 114b, respectively. After that, a known method such as photolithography is used to pattern the conductor layers L1 and L4 to form the wiring patterns 211 and 212 in the conductor layer L1 and the wiring patterns 241 and 242 in the conductor layer L4, as illustrated in FIG. 1. Then, the solder resists 121 and 122 are each formed in a predetermined planar position, followed by mounting of the electronic component 400 and formation of the mold resin 130, whereby the semiconductor IC-embedded substrate 100 according to the present embodiment is completed.

As described above, in the present embodiment, a structure contributing to heat dissipation, i.e., the heat dissipation structure connecting the rewiring pattern 321a and the wiring pattern 211 is not formed by a separate process, but can be formed simultaneously with a process for obtaining a structure connecting the signal or power supply rewiring pattern 321b and the wiring pattern 212, thus allowing the semiconductor IC-embedded substrate 100 to be manufactured with a less number of processes. In addition, in forming the via 253a connecting the conductor layers L2 and L3, two-stage processing including the laser processing and blasting is performed, so that the via 253a can be formed into the shape illustrated in FIG. 3, thus making it possible to increase the connection reliability of the via conductor 253 to be formed inside the via 253a.

Second Embodiment

Figure 18:
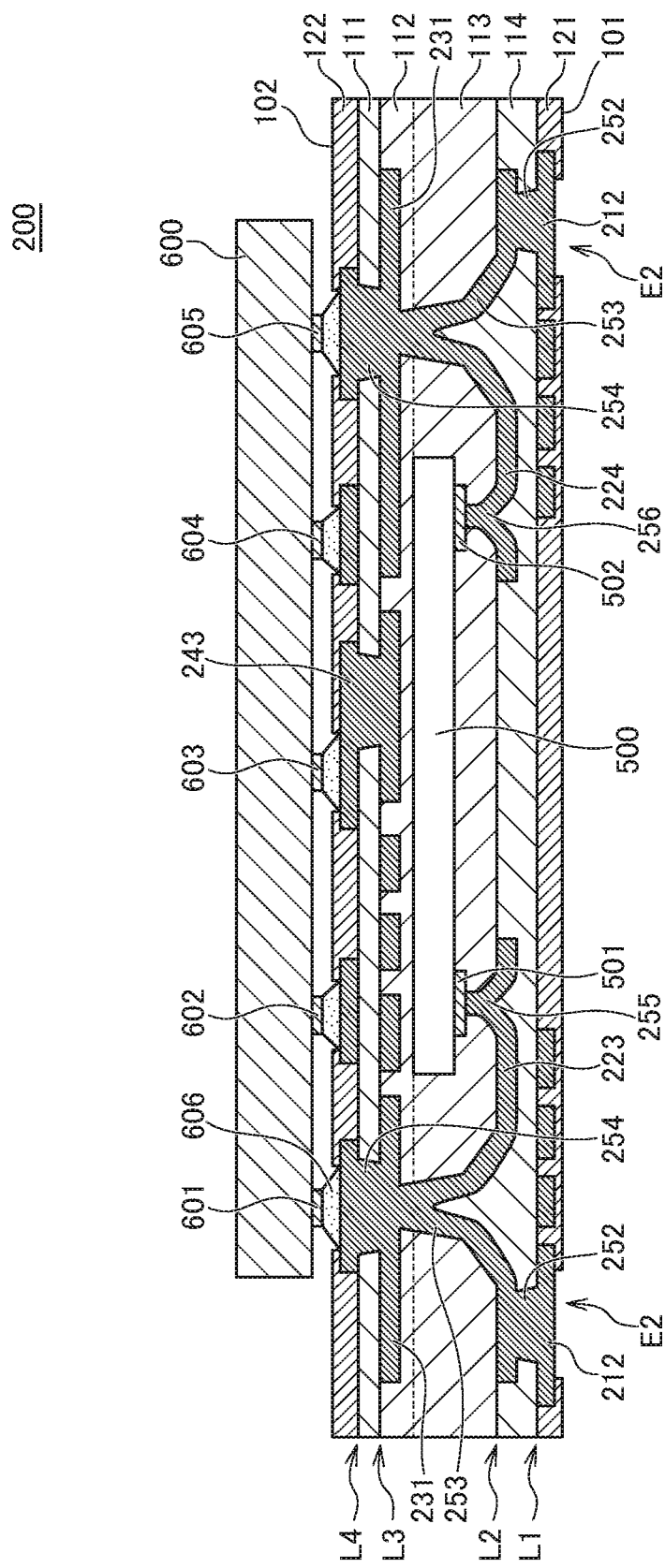
FIG. 18 is a schematic cross-sectional view for explaining the structure of a thin film capacitor-embedded circuit board according to a second embodiment of the present invention.

FIG. 18 is a schematic cross-sectional view for explaining the structure of a thin film capacitor-embedded circuit board 200 according to the second embodiment of the present invention.

As illustrated in FIG. 18, the thin film capacitor-embedded circuit board 200 according to the present embodiment differs from the semiconductor IC-embedded circuit board 100 according to the first embodiment in that it has a thin film capacitor 500 embedded therein in place of the semiconductor IC 300 and that it has a semiconductor IC 600 mounted thereon in place of the electronic component 400. The thin film capacitor 500 has a pair of terminal electrodes 501 and 502. The terminal electrode 501 is connected to a wiring pattern 223 through a via conductor 255, and the terminal electrode 502 is connected to a wiring pattern 224 through a via conductor 256. The semiconductor IC 600 has a plurality of pad electrodes 601 to 605. The pad electrodes 601 to 605 are connected to a wiring pattern 243 of the conductor layer L4 through a solder 606. For example, the pad electrodes 601 and 605 are applied with a power supply potential and a ground potential, respectively. The pad electrode 601 is connected to the terminal electrode 501 of the thin film capacitor 500 through the wiring pattern 223, and the pad electrode 602 is connected to the terminal electrode 502 of the thin film capacitor 500 through the wiring pattern 224, whereby the thin film capacitor 500 functions as a decoupling capacitor for the semiconductor IC 600.

In the present embodiment, as illustrated in FIGS. 3 and 4, not only the via in which the via conductor 253 is embedded, but also the vias in which the via conductors 255 and 256 each have a shape formed by the sections S1 and S2. That is, the vias in which the via conductors 255 and 256 are embedded each have the section S1 in which a reduction in the diameter per unit depth is large and the section S2 in which the reduction is small. Thus, the coverage of the via conductors 255 and 256 is enhanced, with the result that connection reliability can be increased.

The following describes a manufacturing method for the thin film capacitor-embedded circuit board 200 according to the present embodiment.

Figure 19:
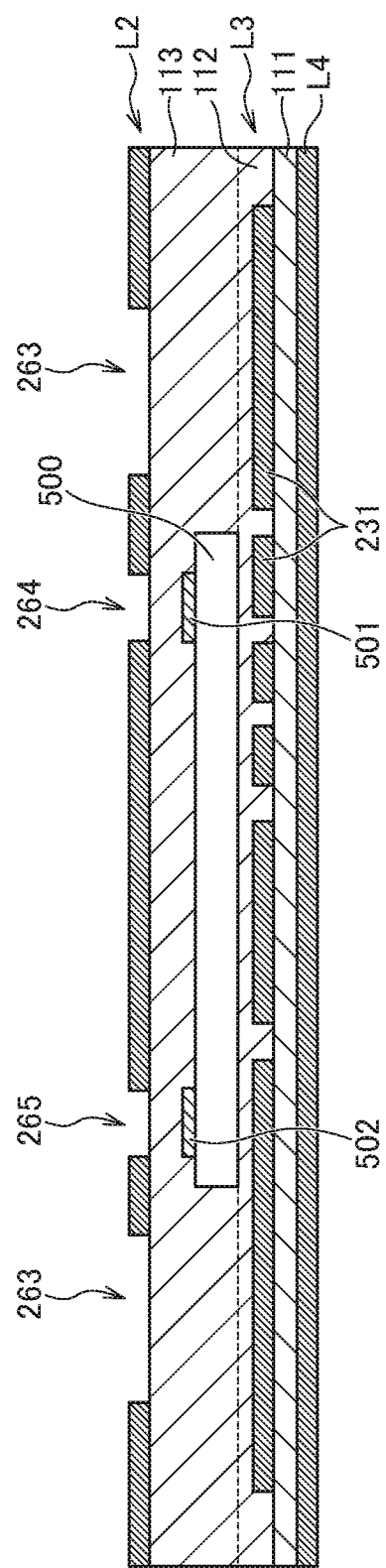
FIGS. 19 to 22 are process views for explaining the manufacturing method for the thin film capacitor-embedded circuit board shown in FIG. 18.

After execution of the processes described using FIGS. 6 to 9, a part of the conductor layer L2 is etched to be removed using a known technique such as photolithography to form openings 263 to 265 for exposing therethrough the insulating layer 113, as illustrated in FIG. 19. The opening 263 is formed at a position not overlapping the thin film capacitor 500 and overlapping the wiring pattern 231 of the conductor layer L3, and openings 264 and 265 are formed at positions overlapping the terminal electrodes 501 and 502 of the thin film capacitor 500, respectively.

Figure 20:
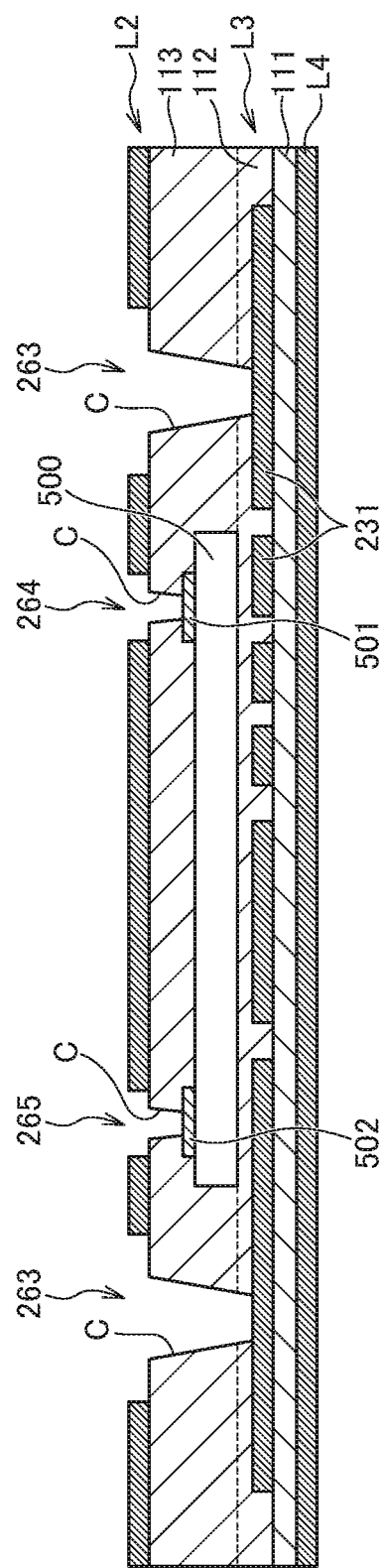

Then, as illustrated in FIG. 20, laser processing is applied to the center of the opening 263 to form a via C in the insulating layers 112 and 113. Further, laser processing is applied to the centers of the respective openings 264 and 265 to form the via C in the insulating layer 113. The via C has a shape corresponding to the dashed line C in FIG. 3. That is, the entire via C has the same shape as the shape of the section S2. The laser light is not irradiated overall on each of the openings 263 to 265, but only on the center of each of them so as to leave a ring-shaped unprocessed region.

Figure 21:
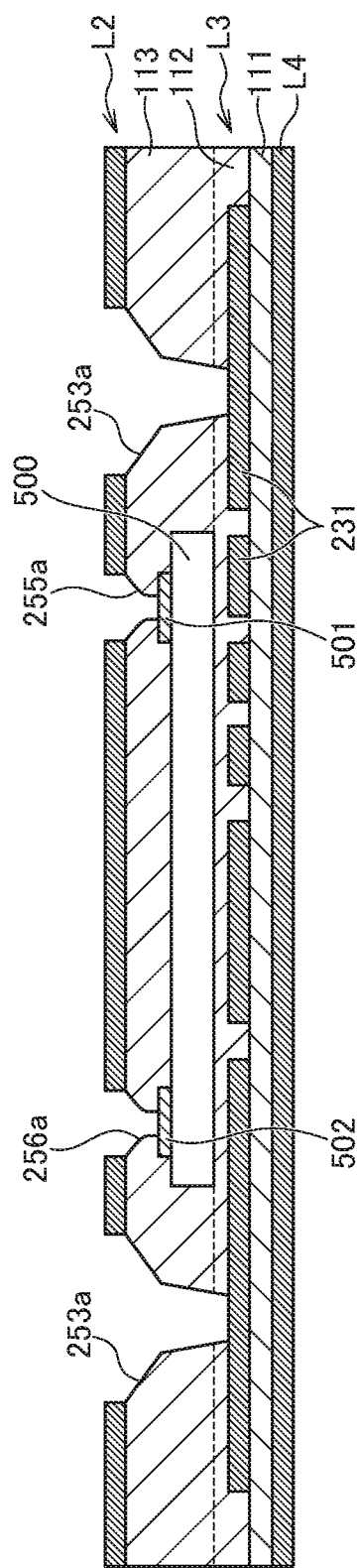

Then, as illustrated in FIG. 21, blasting is applied overall with the conductor layer L2 as a mask to remove the insulating layer 113 at a portion where it is not covered with the conductor layer L2. As a result, the diameter of the upper portion of the via C is enlarged by the blasting at positions corresponding respectively to the openings 263 to 265 of the conductor layer L2, whereby vias 253a, 255a and 256a each having the sections S1 and S2 shown in FIG. 3 are formed. Thus, the vias 253a, 255a and 256a are each subjected to laser processing and then to blasting to have a shape formed by the sections S1 and S2 illustrated in FIG. 3. Therefore, the shape of the section S1 is mainly due to the blasting, and the shape of the section S2 is mainly due to the laser processing.

Figure 22:
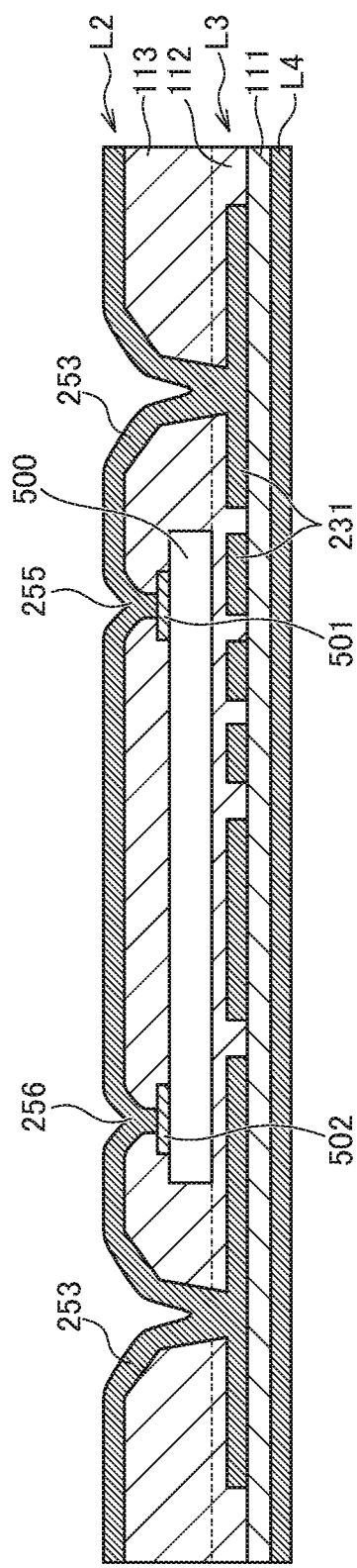

Then, as illustrated in FIG. 22, electroless plating and electrolytic plating are applied to form the via conductors 253, 255 and 256.

Thereafter, the processes described using FIGS. 14 to 17 are executed, followed by mounting of the semiconductor IC 600, whereby thin film capacitor-embedded circuit board 200 according to the present embodiment is completed.

As exemplified in the present embodiment, a plurality of vias different in depth may have a shape formed by the sections S1 and S2. Further, the via having a shape formed by the sections S1 and S2 need not connect two conductor layers (e.g., conductor layers L2 and L3) but may connect a certain conductor layer (e.g., conductor layer L2) and a terminal electrode (e.g., terminal electrode 501 or 502) of the electronic component embedded in the circuit board. Furthermore, while an example in which the thin film capacitor 500 having two terminals is embedded in the circuit board has been shown in the present embodiment, even when an electronic component or a semiconductor IC having a larger number of terminals is employed, the via for exposing the electronic component or semiconductor IC may have the shape formed by the sections S1 and S2. Even in this case, the same effects as those of the present embodiment can be expected.

It is apparent that the present invention is not limited to the above embodiments, but may be modified and changed without departing from the scope and spirit of the invention.

What is claimed is:

1. A circuit board comprising:
   first and second conductor including first and second wiring patterns, respectively;
   a first insulating layer positioned between the first and second conductor layers; and
   a second insulating layer covering the first conductor layer such that the first conductor layer is sandwiched between the first and second insulating layers; and
   a first via conductor formed inside a first via penetrating the first insulating layer and connecting the first and second wiring patterns,
   wherein the first via has a shape in which a diameter thereof is reduced in a depth direction,
   wherein the first via has a first section positioned on the first conductor layer side and a second section positioned on the second conductor layer side,
   wherein a reduction in the diameter per unit depth in the first section is greater than that in the second section,
   wherein a part of the second insulating layer is embedded in the first section of the first via such that an inner surface of the first via in the first section is covered with the first via conductor and that the part of the second insulating layer is surrounded by the first via conductor covering the inner surface of the via in the first section, and
   wherein at least a part of the second section of the first via is filled by the first via conductor such that a thickness of the first via conductor in the second section of the first via is greater than the first and second wiring patterns.

2. The circuit board as claimed in claim 1, wherein the first section has a shape in which a reduction in the diameter per unit depth becomes greater as a position in the depth direction becomes deeper.

3. The circuit board as claimed in claim 1, further comprising a semiconductor IC embedded in the first insulating layer,
   wherein a thickness of the semiconductor IC is less than a depth dimension of the second section, and
   wherein a depth position of the semiconductor IC is within the second section.

4. The circuit board as claimed in claim 1, wherein another part of the second insulating layer is embedded in a part of the second section of the first via such that an inner surface of the first via in the part of the second section is covered with the first via conductor and that the another part of the second insulating layer is surrounded by the first via conductor covering the inner surface of the via in the part of the second section.

5. The circuit board as claimed in claim 4, wherein a remaining part of the second section of the first via is filled by the first via conductor.

6. The circuit board as claimed in claim 5, wherein the remaining part of the second section of the first via is longer in the depth direction than the part of the second section of the first via.

7. The circuit board as claimed in claim 3, further comprising a third conductor layer formed on the second insulating layer such that the second insulating layer is sandwiched between the first and third conductor layers, wherein the first conductor layer further includes a third wiring pattern, wherein the semiconductor IC has first and second rewiring patterns contacting with the first and third wiring patterns, respectively, wherein the third wiring pattern is connected to the third conductor layer by a plurality of second via conductors penetrating the second insulating layer.

8. The circuit board as claimed in claim 7, wherein the second rewiring pattern is greater in area than the first rewiring pattern.

9. The circuit board as claimed in claim 8, wherein the second rewiring pattern is supplied with a power supply potential.

10. The circuit board as claimed in claim 8, wherein the first conductor layer further includes a fourth wiring pattern, wherein the second conductor layer further includes a fifth wiring pattern, wherein the first insulating layer further includes a third via in which a third via conductor connecting the fourth and fifth wiring patterns is embedded, wherein the third via has a shape in which a diameter thereof is reduced in the depth direction, wherein the third via has a first section positioned on the first conductor layer side and a second section positioned on the second conductor layer side, wherein a reduction in the diameter per unit depth in the first section of the third via is greater than that in the second section of the third via.

11. The circuit board as claimed in claim 10, wherein the semiconductor IC further has a third rewiring pattern contacting with the fourth wiring pattern, and wherein the second rewiring pattern is greater in area than the third rewiring pattern.

12. The circuit board as claimed in claim 11, wherein the second rewiring pattern is arranged between the first and third rewiring patterns.

\* \* \* \* \*